United States Patent
Vo et al.

(10) Patent No.: US 10,667,621 B2
(45) Date of Patent: Jun. 2, 2020

(54) MULTI-STAGE MEMORY SENSING

(71) Applicant: Micron Technology, Inc., Boise, ID (US)

(72) Inventors: Huy T. Vo, Boise, ID (US); Adam S. El-Mansouri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/957,742

(22) Filed: Apr. 19, 2018

(65) Prior Publication Data

US 2018/0308538 A1    Oct. 25, 2018

(51) Int. Cl.
| | |
|---|---|
| *G11C 11/22* | (2006.01) |
| *A47C 20/00* | (2006.01) |
| *G11C 7/06* | (2006.01) |
| *A47C 13/00* | (2006.01) |
| *A47C 17/02* | (2006.01) |
| *H01L 27/11502* | (2017.01) |

(52) U.S. Cl.
CPC .......... *A47C 20/021* (2013.01); *A47C 13/005* (2013.01); *A47C 17/02* (2013.01); *G11C 7/06* (2013.01); *G11C 7/067* (2013.01); *G11C 11/221* (2013.01); *G11C 11/2255* (2013.01); *G11C 11/2257* (2013.01); *G11C 11/2273* (2013.01); *G11C 11/2275* (2013.01); *H01L 27/11502* (2013.01); *G11C 2207/063* (2013.01); *G11C 2207/068* (2013.01)

(58) Field of Classification Search
CPC ........................... G11C 11/221; G11C 11/2273
See application file for complete search history.

(56) References Cited

U.S. PATENT DOCUMENTS

| | | | |
|---|---|---|---|
| 10,388,353 B1 * | 8/2019 | Hattori | H01L 27/11514 |
| 2005/0063214 A1 * | 3/2005 | Takashima | G11C 11/22 365/145 |
| 2010/0128515 A1 * | 5/2010 | Fukushi | G11C 11/22 365/149 |
| 2017/0358340 A1 | 12/2017 | Kawamura et al. | |
| 2017/0365318 A1 | 12/2017 | Ingalls et al. | |
| 2018/0061469 A1 | 3/2018 | Derner et al. | |

OTHER PUBLICATIONS

ISA/KR, International Search Report and Written Opinion of the International Searching Authority, Int'l Appl. No. PCT/US2019/025233, dated Sep. 16, 2019, Korean Intellectual Property Office, Seo-gu, Daejeon, Republic of Korea, 13 pgs.

* cited by examiner

*Primary Examiner* — Hoai V Ho
*Assistant Examiner* — Jay W. Radke
(74) *Attorney, Agent, or Firm* — Holland & Hart LLP

(57) ABSTRACT

Methods and devices for reading a memory cell using multi-stage memory sensing are described. The memory cell may be coupled to a digit line after the digit line during a read operation. A transistor may be activated to couple an amplifier capacitor with the digit line during the read operation. The transistor may be deactivated for a portion of the read operation to isolate the amplifier capacitor from the digit line while the memory cell is coupled to the digit line. The transistor may be reactivated to recouple the amplifier capacitor to the digit line to help determine the value of the memory cell.

25 Claims, 10 Drawing Sheets

MULTI-STAGE MEMORY SENSING

BACKGROUND

The following relates generally to operating a memory array and more specifically to techniques for reading a memory cell using multi-stage memory sensing.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

In general, memory devices may be improved by increasing memory cell density, increasing read/write speeds, increasing reliability, increasing data retention, reducing power consumption, or reducing manufacturing costs, among other metrics. In some cases, a read operation of an FeRAM memory cell may be susceptible to noise due to one or more transistors that are coupled to a digit line of the memory cell operating in a deep sub-threshold regime.

DETAILED DESCRIPTION

Figure 1:
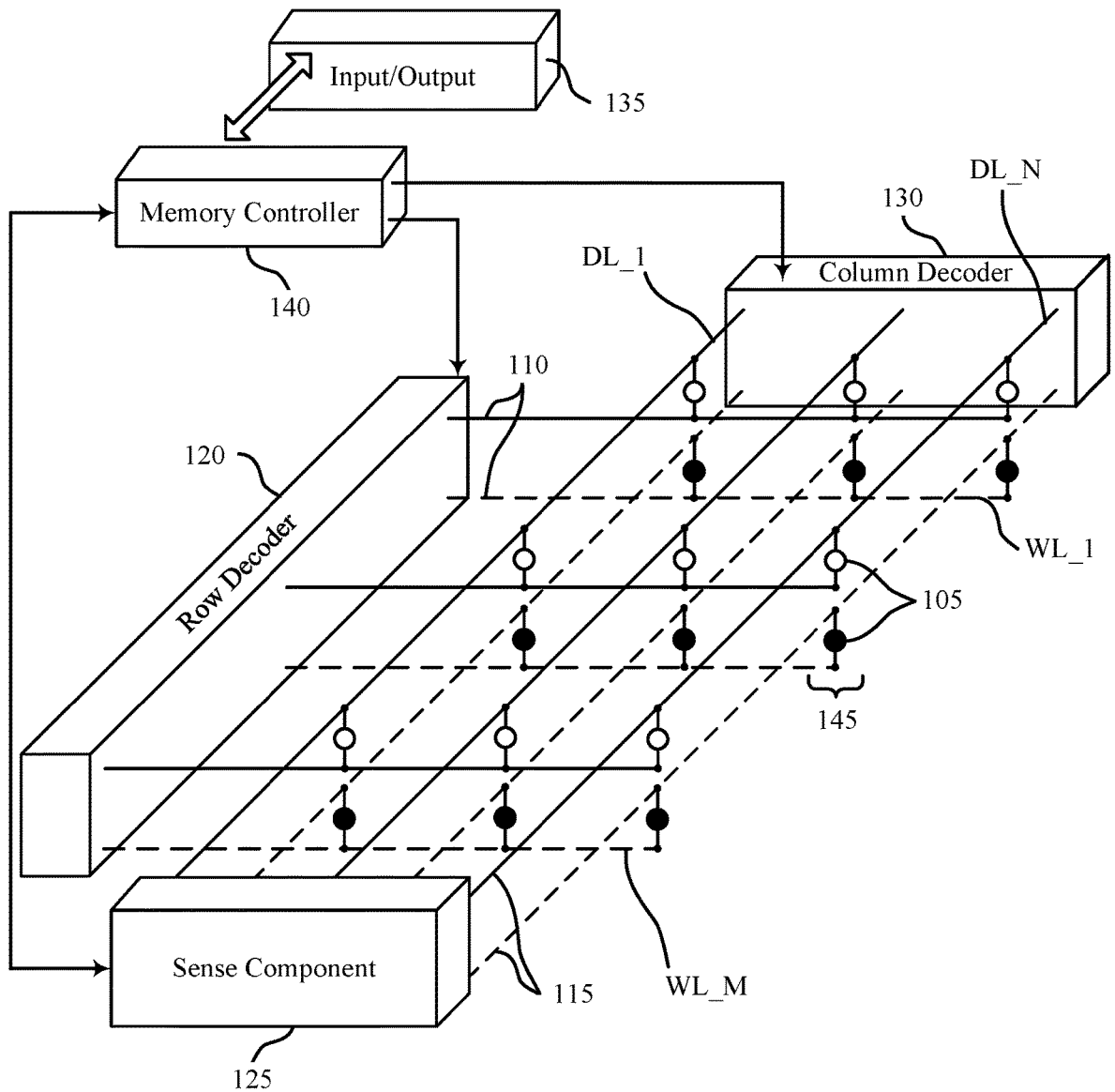
FIG. 1 illustrates an example of a memory array that supports techniques for reading a memory cell using multi-stage memory sensing in accordance with embodiments of the present disclosure.

Ferroelectric memory cells include a capacitor that stores the value of the memory cell. Reading the value of the memory cell may involve coupling a digit line to the memory cell and transferring charge between the memory cell capacitor and the digit line, then using a sense component to determine the value of the memory cell based on the resulting voltage of the digit line.

As will be described in more detail herein, the sense component of some ferroelectric memory devices includes an amplifier capacitor. Electric charge may be transferred between the amplifier capacitor and the memory cell via the digit line during a read operation. The amount of charge that is transferred between the amplifier capacitor and the memory cell may depend on the initial value stored in the memory cell. The amplifier capacitor may be charged to an initial known voltage before the read operation, and the change in the amplifier capacitor voltage during the read operation (due to the transferred electric charge) may be used to detect the value of the memory cell. The sense component may compare the voltage across the amplifier capacitor (which may serve as a proxy for the voltage on the digit line) with a reference voltage to determine the value of the memory cell. The memory device may then latch the value, thereby completing the read operation.

Some memory devices use a transistor, such as a MOS transistor, as a switching component to couple the amplifier capacitor with the digit line of the memory cell at the initiation of a read operation. This switching transistor may remain activated during the entire read operation as electric charge is transferred and the voltage signal from the ferroelectric memory cell develops on the digit line. This approach may have disadvantages, however, in some cases. For example, the transistor may be operating in a deep sub-threshold regime while it is activated. Operation in this regime may make the transistor more susceptible to noise, which in turn may introduce noise into the signal at the amplifier capacitor such that the amount of charge at the amplifier capacitor may not be a faithful representation of the amount of charge transferred from the memory cell. Noise at the amplifier capacitor may, in turn, reduce the accuracy of the read operation. In addition, when the transistor is operated in a deep sub-threshold regime, the time required for the signal to develop on the digit line may vary due to process variations. As a result, it may be difficult to determine when the value is ready to be latched, or it may take a long time for the signal to be ready for latching.

An alternative to the memory sensing approach described above is a multi-stage sensing approach, in which the transistor is toggled from active to inactive and back to active for a portion of the read operation, as described in more detail herein.

There may be several advantages to a multi-stage sensing approach. In some cases, toggling the transistor may reduce the amount of time the transistor operates in the deep sub-threshold regime, thereby reducing the amount of noise that may be introduced into the amplifier capacitor during the read operation and improving the accuracy of the read operation. In addition, toggling the transistor may reduce the amount of time required for the voltage at the amplifier capacitor to settle to a steady state value that can be latched, thereby increasing the speed of the read operation. Further, it may be possible for the memory device to perform additional operations during the portion of the read operation in which the transistor is deactivated.

Features of the disclosure introduced above are further described below in the context of FIGS. 1 through 3. Specific examples and benefits are then described with respect to FIGS. 4 through 7. These and other features of the disclosure are further illustrated by and described with reference to apparatus diagrams, system diagrams, and flowcharts that relate to techniques for reading a memory cell using multi-stage memory sensing.

FIG. 1 illustrates an example of a memory array 100 that supports techniques for reading a memory cell using multi-stage memory sensing in accordance with embodiments of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus or device. Memory array 100 includes memory cells 105 that are programmable to store different states. In some cases, each memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, and access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present (not shown), such as plate lines, for example. It should be appreciated that the exact operation of the memory device may be altered based on the type of memory cell and/or the specific access lines used in the memory device.

Asserting (e.g., activating or selecting) a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include 2D memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely a cell plate node via a plate line.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_$N$, where M and N depend on the array size. Thus, by activating a word line 110 and a digit line 115, e.g., WL_2 and DL_3, the memory cell 105 at their intersection may be accessed. In addition, an access operation of ferroelectric memory cells may need to activate a corresponding plate line for the memory cell 105, associated with plate line decoder (not shown).

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Alternatively, sense component 125 may be connected to or in electronic communication with column decoder 130 or row decoder 120.

In some embodiments, the sense component 125 may include a capacitor configured to be pre-charged to a known voltage level. This capacitor may be referred to as an amplifier capacitor. The amplifier capacitor may be coupled with a selected digit line 115 to allow a transfer of electric charge between the amplifier capacitor and memory cell 105. The amount of charge transferred between memory cell 105 and the amplifier capacitor may correspond to a logic state of the memory cell 105 (e.g., a logic state of 1 or 0). Thus, the amplifier capacitor may be used to detect a signal from the memory cell 105 during the read operation, since the voltage remaining on the amplifier capacitor after some amount of electric charge has been transferred between the amplifier capacitor and memory cell 105 is indicative of the logic state of memory cell 105.

In some cases, during a read operation, the amplifier capacitor may initially be coupled to the selected digit line 115 to raise the voltage of digit line 115 to an initial sensing voltage, then decoupled (isolated) from the digit line 115 for a portion of the read operation as the ferroelectric capacitor of the memory cell discharges onto the digit line 115 and the signal on the digit line 115 develops, then recoupled to the digit line 115 to transfer additional charge with memory cell 105 and detect a value of the memory cell 105.

A memory cell 105 may be set, or written, by similarly activating the relevant word line 110 and digit line 115— e.g., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So, the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100.

In some embodiments, the memory controller 140 may control various phases of a read operation. In some cases, the memory controller 140 may control various timings associated with pre-charging an amplifier capacitor that is configured to detect a logic state of the memory cell 105, such as coupling the amplifier capacitor with a voltage supply node to pre-charge the amplifier capacitor, coupling or uncoupling the pre-charged amplifier capacitor to the selected digit line, or the like. In some cases, the memory controller 140 may control various timings associated with activating or deactivating a transistor configured to couple or uncouple the amplifier capacitor with the digit line.

In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line that is connected with a word line and a digit line may need to be activated to access a certain memory cell 105 of the memory array. It should be appreciated that the exact operation of the memory device may vary based on the type of memory cell and/or the specific access lines used in the memory device.

Figure 2:
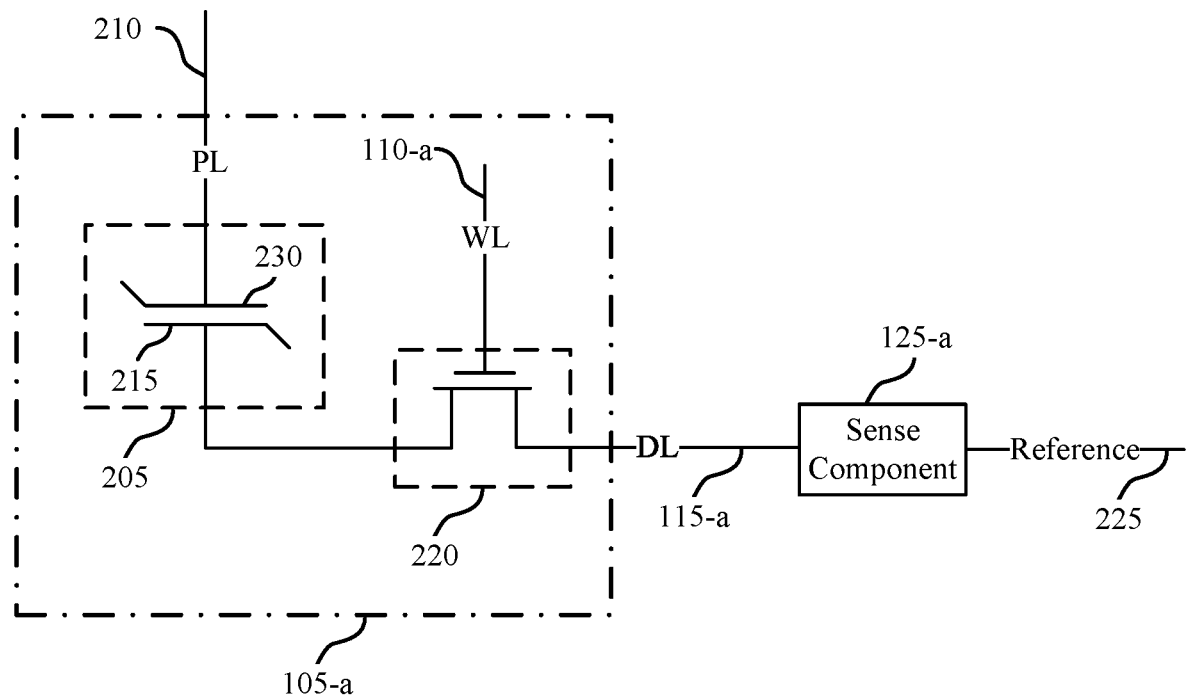
FIG. 2 illustrates an example of a circuit that supports techniques for reading a memory cell using multi-stage memory sensing in accordance with embodiments of the present disclosure.

FIG. 2 illustrates an exemplary diagram 200 of a ferroelectric memory cell and circuit components that supports techniques for reading a memory cell using multi-stage memory sensing accordance with embodiments of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selector device 220 and reference line 225. Cell plate 230 may be accessed via plate line 210 and cell bottom 215 may be accessed via digit line 115-*a*. As described above, various states may be stored by charging or discharging the capacitor 205.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selector device 220 is deactivated, and capacitor 205 can be connected to digit line 115-*a* when selector device 220 is activated. Activating selector device 220 may be referred to as selecting memory cell 105-*a*. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-*a* may activate the selector device 220; for example, a voltage applied to word line 110-*a* is applied to the transistor gate, connecting the capacitor 205 with digit line 115-*a*.

In other examples, the positions of selector device 220 and capacitor 205 may be switched, such that selector device 220 is connected between plate line 210 and cell plate 230 and such that capacitor 205 is between digit line 115-*a* and the other terminal of selector device 220. In this embodiment, selector device 220 may remain in electronic communication with digit line 115-*a* through capacitor 205. This configuration may be associated with alternative timing and biasing for read and write operations.

Due to the ferroelectric material between the plates of ferroelectric capacitor 205, and as discussed in more detail below, ferroelectric capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing the plate line 210 and word line 110-*a*.

Biasing the plate line 210 may result in a voltage difference (e.g., plate line 210 voltage minus digit line 115-*a* voltage) across ferroelectric capacitor 205. The voltage difference may yield a change in the stored charge on ferroelectric capacitor 205, where the magnitude of the change in stored charge may depend on the initial state of ferroelectric capacitor 205—e.g., whether the initial state stored a logic 1 or a logic 0. This may cause a change in the voltage of digit line 115-*a* based on the charge stored on ferroelectric capacitor 205. Operation of memory cell 105-*a* by varying the voltage to cell plate 230 may be referred to as "moving cell plate."

The change in voltage of digit line 115-*a* may depend on its intrinsic capacitance. That is, as charge flows through digit line 115-*a*, some finite charge may be stored in digit line 115-*a* and the resulting voltage may depend on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be set to a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage.

In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

As previously discussed, in some cases, the sense amplifier may receive the voltage at a node of an amplifier capacitor in the sense component 125-*a* and compare it with reference line 225 instead of comparing the voltage of digit line 115-*a* with reference line 225. In some cases, the latch circuitry (e.g., in the sense amplifier) is isolated from the amplifier capacitor prior to activating the latch circuitry to latch the value.

In some embodiments, during a read operation, the amplifier capacitor may be coupled with the digit line 115-*a* to set the voltage of digit line 115-*a* to an initial sensing voltage (e.g., before memory cell 105 is coupled with digit line 115-*a*). When memory cell 105-*a* is subsequently coupled to digit line 115-*a*, the capacitor 205 of memory cell 105-*a* may begin to discharge onto digit line 115-*a*, thereby beginning signal development on digit line 115-*a*.

The amplifier capacitor may then be isolated from the digit line 115-*a* for a portion of the read operation as the signal from memory cell 105-*a* continues to develop on digit line 115-*a*, then recoupled with digit line 115-*a* to enable electric charge to be transferred between the amplifier capacitor and the memory cell and detect the value of memory cell 105-*a*. The amplifier capacitor may be coupled and uncoupled with digit line 115-*a* by activating and deactivating a transistor that couples the amplifier capacitor to the digit line 115-*a*.

To write a value to a memory cell 105-*a*, a voltage may be applied across capacitor 205. Various methods may be used. In one example, selector device 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
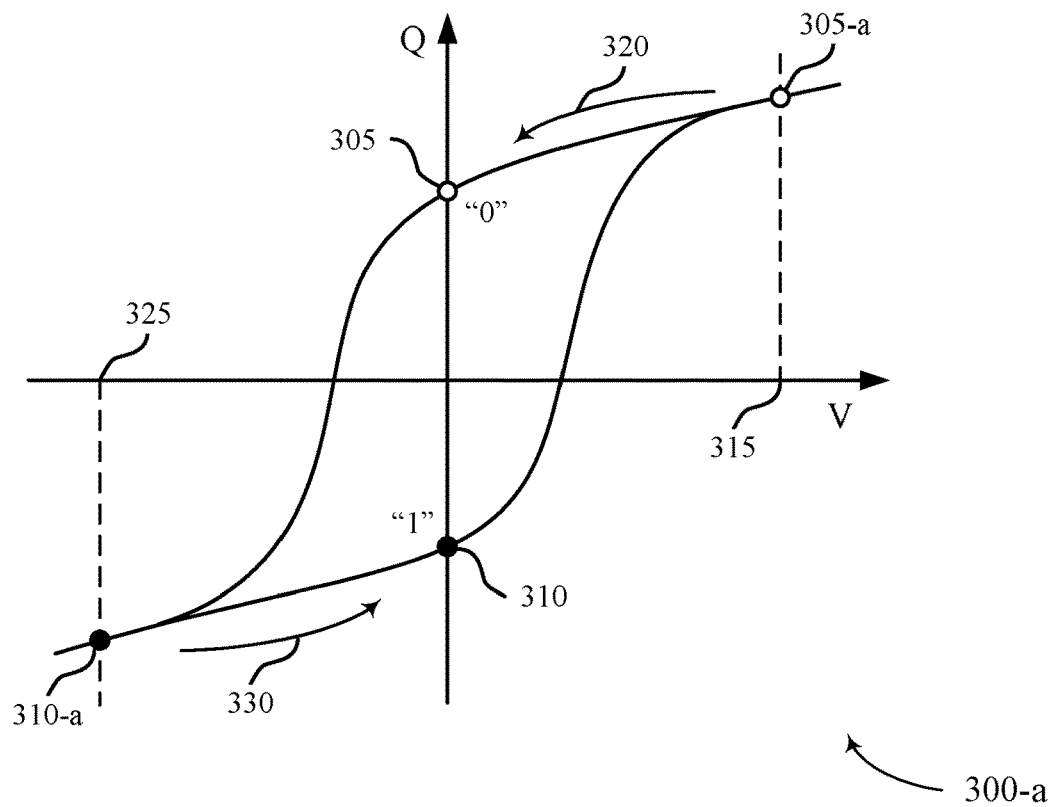
FIG. 3 illustrates an example of hysteresis curves that support techniques for reading a memory cell using multi-stage memory sensing in accordance with embodiments of the present disclosure.
Figure 3:
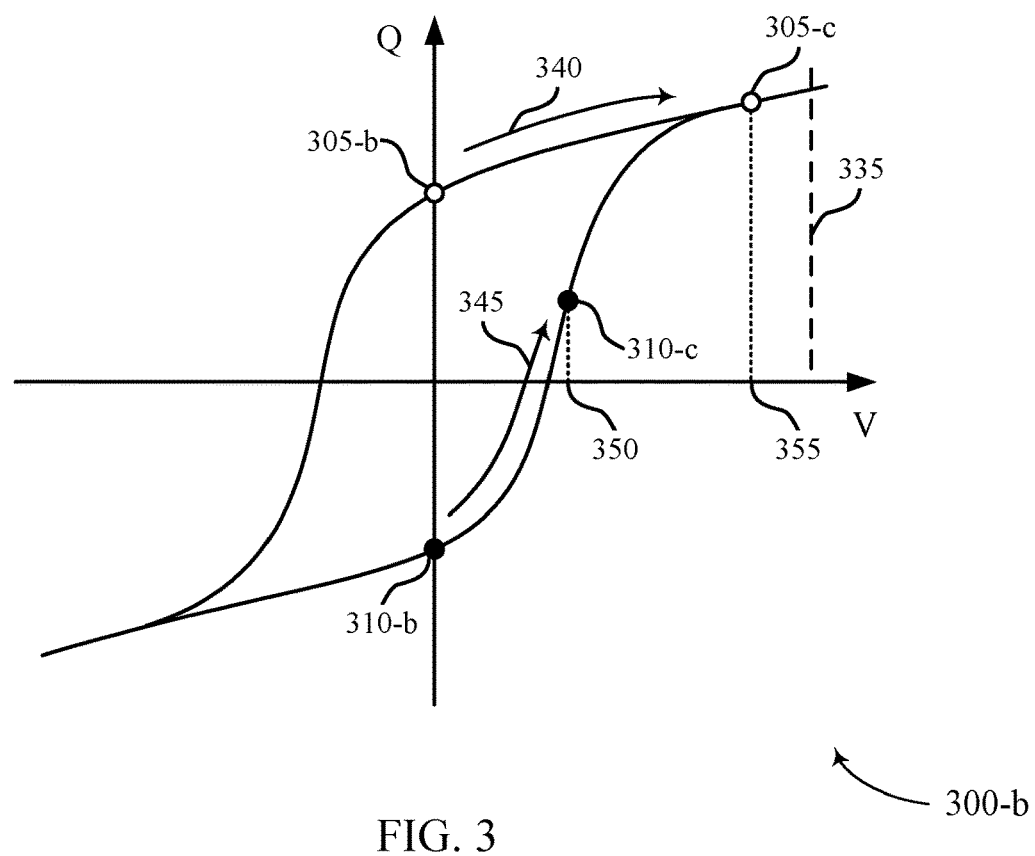

FIG. 3 illustrates an example of non-linear electrical properties with hysteresis curves 300-a and 300-b for a ferroelectric memory cell that supports techniques for reading a memory cell using multi-stage memory sensing in accordance with embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, e.g., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)).

A negative voltage may be applied by maintaining the terminal in question at ground and applying a positive voltage to the second terminal—e.g., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, e.g., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—e.g., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-c and 310-c on hysteresis curve 300-b may thus depend on the capacitance of the digit line and may be determined through a load-line analysis—e.g., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—e.g., (voltage 335-voltage 350) or (voltage 335-voltage 355). The reference voltage may be generated such that its magnitude is between the two possible voltages of the two possible digit line voltages in order to determine the stored logic state—e.g., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (e.g., a logic 0 or 1) may be determined.

In some examples, an amplifier capacitor (not shown) may be used during a read operation in a manner that amplifies the charge stored on the memory cell to increase the accuracy of the read operation. In some examples, the amplifier capacitor may be coupled to the digit line to provide an initial sensing voltage to the digit line, then isolated from the digit line as the memory cell capacitor discharges onto the digit line, then recoupled to the digit line to help detect the value of the memory cell.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
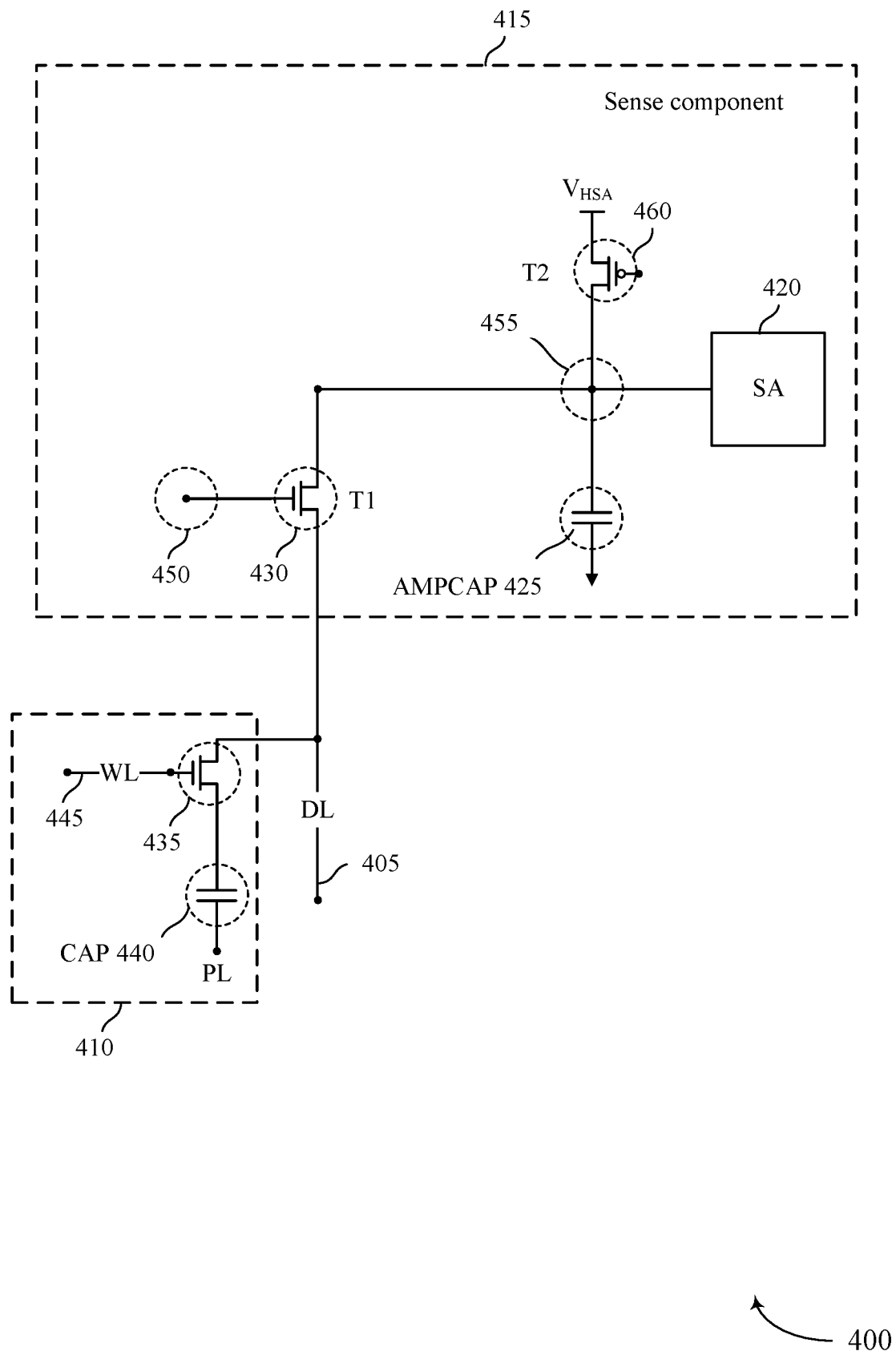
FIG. 4 illustrates an example of a circuit that supports techniques for reading a memory cell using multi-stage memory sensing in accordance with embodiments of the present disclosure.

FIG. 4 illustrates an example of a circuit 400 that supports techniques for reading a memory cell using multi-stage memory sensing in accordance with embodiments of the present disclosure. The circuit 400 illustrates a simplified circuit configuration to highlight several circuit components that work together to enable multi-stage memory sensing that provides a fast and reliable read operation.

The circuit 400 includes a digit line (DL) 405, a memory cell 410, and a sense component 415. The DL 405 may be an example of the digit lines 115 described with reference to FIGS. 1 and 2. The memory cell 410 may be an example of the memory cells 105 described with reference to FIGS. 1 and 2. The sense component 415 may be an example of or some portion of the sense component 125 described with reference to FIGS. 1 and 2.

The memory cell 410 may include a selector device 435 and a capacitor 440. In some cases, the capacitor 440 may be an example of a ferroelectric capacitor, such as capacitor 205 described with reference to FIG. 2. The selector device 435 may be an example of the selector device 220 described with reference to FIG. 2. The memory cell 410 may be associated with a word line (WL) 445. The WL 445 may be an example of the word line 110 described with reference to FIGS. 1 and 2, and may be used to select memory cell 410 as described below.

The capacitor 440 may store a logic state (e.g., a logic state of 1 or 0). During an access operation (e.g., a read operation or a write operation), the WL 445 may be asserted (e.g., selected) and the selector device 435 may couple the capacitor 440 with the DL 405.

The sense component 415 may include transistors T1 430 and T2 460. The sense component 415 may further include an amplifier capacitor (AMPCAP) 425 and a sense amplifier (SA) 420. In some embodiments, T1 may be part of a cascode (not shown).

In some embodiments, T2 may be configured to connect the AMPCAP 425 to a supply voltage $V_{HSA}$ to pre-charge the AMPCAP 425 to a known voltage $V_{HSA}$ (e.g., a high voltage for the sense amplifier). For example, the AMPCAP 425 may be pre-charged to $V_{HSA}$ prior to or during a read operation such that a voltage across the AMPCAP 425 at the completion of the read operation may correspond to either a first voltage indicating a logic state of 0 stored at the capacitor 440 or a second voltage indicating a logic state of 1 stored at the capacitor 440. In this manner, AMPCAP 425 may be used to determine a value of memory cell 410.

In some embodiments, T1 430 may be activated or deactivated by asserting or deasserting (respectively) a control signal at a gate node 450 of T1 430. In some embodiments, activating T1 430 may couple AMPCAP 425 with digit line DL 405. In some embodiments, during a read operation T1 430 may be activated to couple the AMPCAP 425 with the digit line DL 405 to set the voltage of DL 405 to an initial sensing voltage before memory cell 410 is coupled to digit line 405, then deactivated to isolate the AMPCAP 425 from DL 405 for a portion of the read operation while memory cell 410 is coupled to DL 405, then reactivated to recouple the AMPCAP 425 with DL 405 to transfer additional charge between AMPCAP 425 and memory cell 410 via DL 405.

In some embodiments, the voltage at a node 455 of AMPCAP 425 changes based on the amount of charge transferred between AMPCAP 425 and memory cell 410. After T1 is reactivated, sense component 415 may determine the value of memory cell 410 by comparing a voltage at node 455 of AMPCAP 425 with a reference voltage and may latch the value, thereby completing the read operation.

Detailed operations of the circuit 400 are further illustrated and described with reference to FIG. 5.

Figure 5:
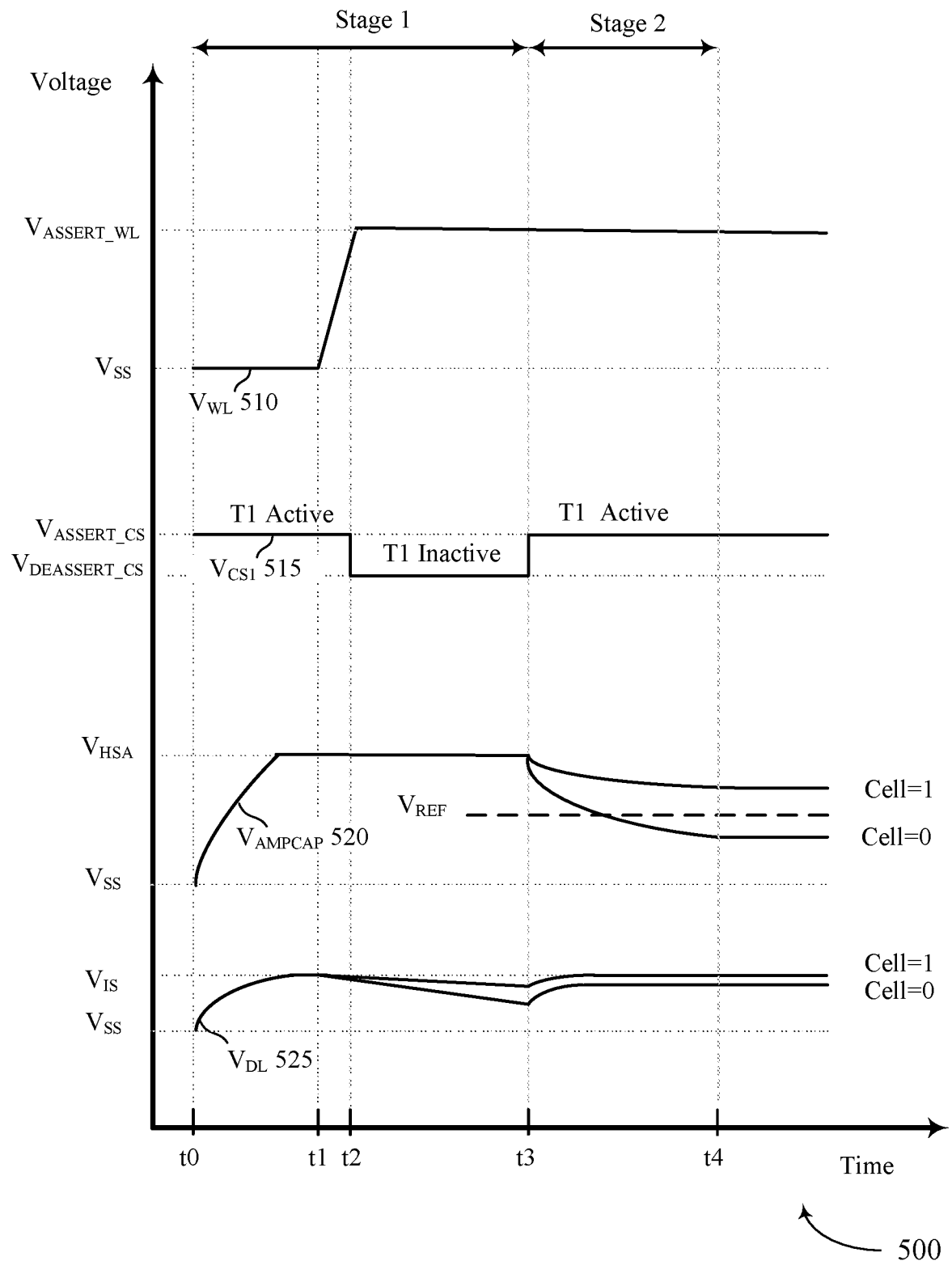
FIG. 5 illustrates an example of a timing diagram that supports techniques for reading a memory cell using multi-stage memory sensing in accordance with embodiments of the present disclosure.

FIG. 5 illustrates an example of a timing diagram 500 that supports reading a memory cell using multi-stage memory sensing in accordance with embodiments of the present disclosure. The timing diagram 500 illustrates various signals during a read operation using multi-phase memory sensing. The read operation may correspond to a time period between t0 and t4 that includes two stages, Stage 1 and Stage 2. The timing diagram 500 shows various voltage levels associated with the components of the circuit 400 described with reference to FIG. 4 to illustrate how the techniques for reading a memory cell using multi-stage memory sensing provide a fast and reliable read operation.

The timing diagram 500 includes a voltage applied to the WL 445 of the memory cell 410 (e.g., $V_{WL}$ 510), a control signal voltage (e.g., $V_{CS1}$ 515) applied to the gate node 450 of transistor T1 to activate T1 and couple amplifier capacitor AMPCAP 425 with DL 405, a voltage at a first node 455 of AMPCAP 425 (e.g., $V_{AMPCAP}$ 520), and a voltage of the DL 405 (e.g., $V_{DL}$ 525).

During an initial idle period prior to t0, the digit line DL 505 and AMPCAP 425 may be kept at ground (or a virtual ground). Thus, $V_{DL}$ 525 and $V_{AMPCAP}$ 520 may be at $V_{SS}$. WL 425 may be deasserted during the idle period. Thus, $V_{WL}$ 510 may be at $V_{SS}$. The memory cell 410 may be isolated from the DL 405 while the WL 425 is deasserted.

At time t0, Stage 1 may begin, which may be referred to as an initial sensing stage. The AMPCAP 425 may be pre-charged to $V_{HSA}$ at time t0 (e.g., through T2). The DL 405 may be pre-charged to $V_{IS}$ at time t0 to t2 through T2 and T1 (e.g., while control signal $V_{CS1}$ asserted and T1 is activated) using, for example, a voltage supply. Thus, the voltage $V_{DL}$ 525 may begin to rise to an initial sensing voltage $V_{IS}$.

At time t1, $V_{WL}$ is asserted, causing memory cell 410 to be coupled with DL 405. Memory cell 410 begins to discharge onto DL 405, thus beginning signal development on DL 405. $V_{DL}$ may decrease as memory cell 410 discharges onto DL 405, and electric charge is transferred between AMPCAP 425 and memory cell 410 via DL 405.

At time t2, control signal $V_{CS1}$ is deasserted, which deactivates transistor T1 and decouples AMPCAP 425 from DL 405. DL 405 remains coupled to memory cell 410, and the signal continues to develop on DL 405 as the ferroelectric capacitor in memory cell 410 continues to discharge onto DL 405. $V_{DL}$ may continue to decrease during this period, with the amount of decrease depending on the initial value of memory cell 410 (e.g., whether memory cell 410 stored a 1 or a 0 value). Thus, during this time period, FIG. 5 denotes the two different levels of $V_{DL}$, each associated with a logic 0 or a logic 1.

While FIG. 5 depicts the assertion of $V_{WL}$ as occurring before $V_{CS1}$ is deactivated, in some cases, $V_{WL}$ may be asserted at essentially the same time that $V_{CS1}$ is deasserted. That is, $V_{WL}$ may be asserted at the same time as or before T1 is deactivated.

At time t3, Stage 2 may begin, which may be referred to as a signal detection stage. The control signal $V_{CS1}$ may be reasserted to reactivate T1, which may recouple the AMPCAP 425 to DL 405. The voltage at the first node of AMPCAP 425, $V_{AMPCAP}$, may begin to decrease as charge is transferred between AMPCAP 425 and DL 405, while $V_{DL}$ rises due to the transferred charge. The amount of charge transferred between AMPCAP 425 and DL 405 depends on the initial value of capacitor 440; e.g., whether memory cell 405 was storing a 1 or a 0 value. Thus, during this time period, FIG. 5 denotes the two different levels of $V_{DL}$ and $V_{AMPCAP}$, each associated with a logic 0 or a logic 1.

Since the DL 405 (coupled with the capacitor 440) was previously pre-charged to a (known) initial sensing voltage $V_{IS}$ using a voltage supply, the amount of charge transferred between AMPCAP 425 and memory cell 410 may correspond to the charge required by the capacitor 440 to bring the $V_{DL}$ 420 back close to $V_{IS}$. As described above, the charge required to bring $V_{DL}$ close to $V_{IS}$ may vary depending on a logic state stored at the capacitor 440. In some embodiments, a logic state of 0 stored at the capacitor 440 may require a larger amount of charge to be transferred between AMPCAP 425 and memory cell 410 to bring the $V_{DL}$ 525 close to $V_{IS}$ than a logic state of 1 stored at capacitor 440.

During the signal detection stage, the voltage at the first node of AMPCAP 425 $V_{AMPCAP}$ 520 may decrease. The amount of the decrease in $V_{AMPCAP}$ 520 may depend on the logic state stored at the capacitor 440. Thus, the change in voltage $V_{AMPCAP}$ 525 during Stage 2 (relative to its initial voltage of $V_{HSA}$) represents a logic state of the capacitor 440. In some embodiments, a logic state of 0 stored at the capacitor 440 may result in a greater reduction in $V_{AMPCAP}$ 525 when compared to a logic state of 1 stored at the capacitor 440.

At time t4, the voltage of $V_{AMPCAP}$ 525 may be compared to a reference voltage $V_{REF}$ and captured (e.g., latched) by SA 420 of the sense component 415, thereby completing the read operation. In some embodiments, the specific time t4 at which the value is latched may be based on a trigger condition being satisfied. For example, the trigger condition may include a determination that a timer having a predetermined duration has expired after the transistor is reactivated at t3. Alternatively or additionally, the trigger condition may include a determination that $V_{AMPCAP}$ and/or $V_{DL}$ has settled to substantially a steady-state value.

There may be a number of advantages associated with using multi-stage memory sensing as described above with respect to FIGS. 4-5. As previously noted, toggling the control signal for transistor T1 may reduce the amount of time that T1 operates in the deep sub-threshold regime, thereby reducing the amount of noise introduced onto the digit line. Further, the approach described above may enable the use of a smaller amplifier capacitor (in terms of capacitance) due to the reduction in noise on the amplifier capacitor. That is, the amplifier capacitor does not need to be as large to reduce the sensitivity to swings in voltage due to noise.

Using a smaller amplifier capacitor may, in turn, reduce the amount of power and/or area required for the memory device. Further, using a smaller amplifier capacitor may reduce the elapsed time between when the transistor T1 is reactivated (at time t3) and when the value can be latched (at time t4), since the amplifier capacitor may change its voltage more quickly after being recoupled to the digit line; e.g., $V_{AMPCAP}$ may settle more quickly, particularly for the case when the memory cell value is 0. In some cases, the elapsed time between when the transistor is reactivated and when the signal can be latched may be less than 15 ns; e.g., the predetermined duration of the timer may be less than 15 ns. This may be significantly faster than the time typically required to latch a value without toggling the transistor, which may be on the order of 50-60 ns.

An additional benefit is that, in some cases, a memory device may be able to use the time period during which $V_{CS1}$ is deasserted (t2-t3) to perform other operations, such as using AMPCAP 425 to pre-charge or discharge another node in preparation for another memory access. Such operations may further increase the speed of read or write operations.

Figure 6:
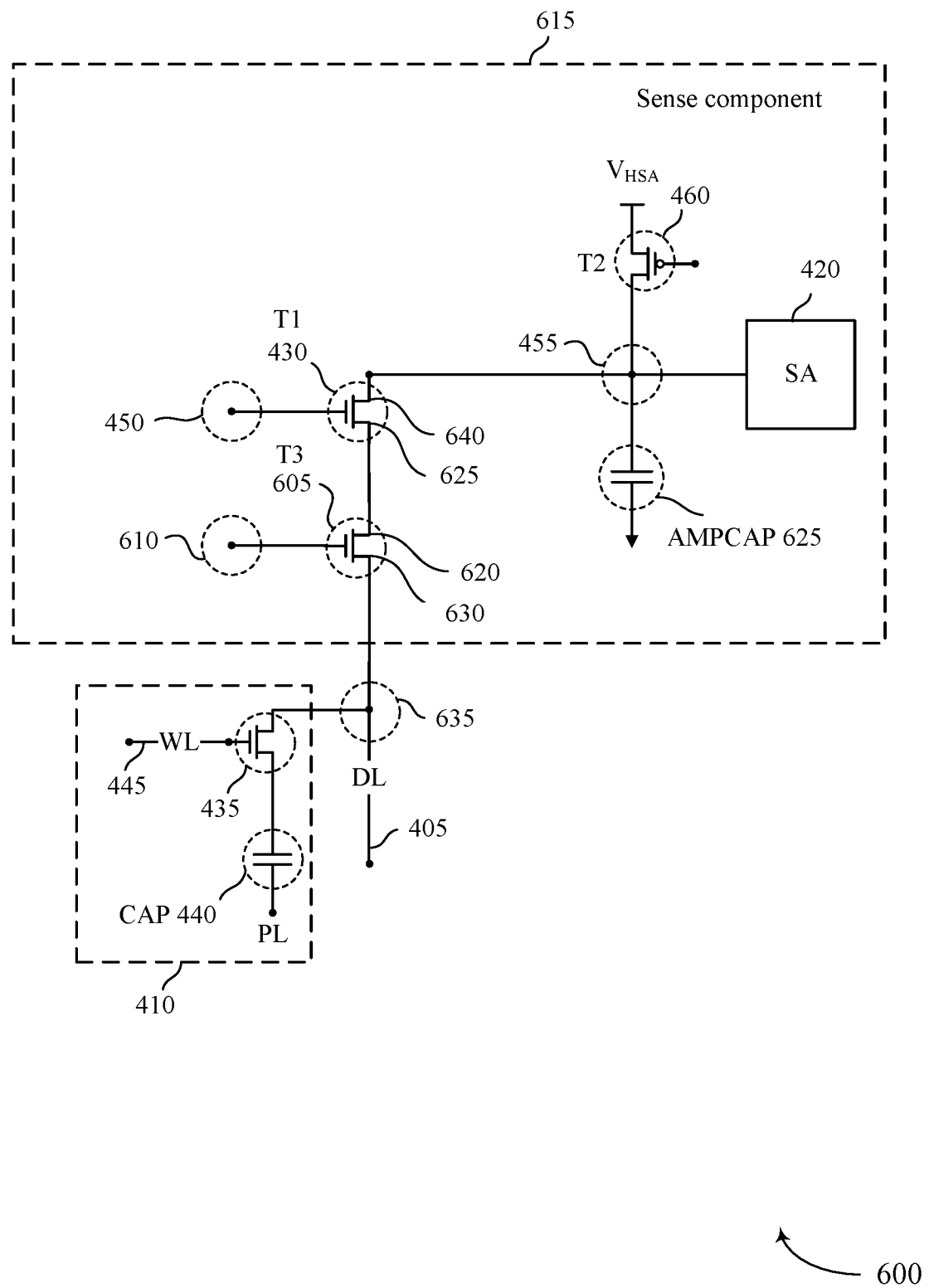
FIG. 6 illustrates an example of a circuit that supports techniques for reading a memory cell using multi-stage memory sensing in accordance with embodiments of the present disclosure.

FIG. 6 illustrates an example of a circuit 600 that supports techniques for reading a memory cell using multi-stage memory sensing in accordance with embodiments of the present disclosure. The circuit 600 illustrates a simplified circuit configuration to highlight several circuit components that work together to enable multi-stage memory sensing that provides a fast and reliable read operation.

Circuit 600 includes the components depicted in circuit 400, but adds transistor T3 605, as described in more detail below.

Sense component 615 may be an example of or some portion of the sense component 125 described with reference to FIGS. 1 and 2. In addition to the components described with respect to FIG. 4, sense component 615 may include transistor T3 605. Transistors T1 and T3 may be connected in series, such that a node (e.g., a source or drain) of T1 is coupled to a node (e.g., a drain or source) of T2. T1 and/or T3 may be part of a cascode (not shown). In some embodiments, AMPCAP 425 is coupled with a node 640 of transistor T1, and a node 630 of transistor T3 is coupled with the digit line DL 405.

In some embodiments, T1 may be configured to be driven by a first control signal $V_{CS1}$ at a gate node 450 of T1 to activate T1 and thereby couple a node 455 of AMPCAP 425 with a node 620 of T3.

In some embodiments, T3 may be configured to be driven by a second control signal $V_{CS2}$ at a gate node 610 of T3 to activate T3 and couple a node 625 of T1 with DL 405. In some embodiments, T3 may remain activated for the duration of a read operation. In some examples, T3 may be active whenever circuit 600 is active; e.g., $V_{CS2}$ may be set to a fixed potential bias.

Activating both T3 and T1 may establish an electrical connection between AMPCAP 425 and DL 405. Transistor T3 605 may act as a source-follower device between transistor T1 430 and DL 405 to reduce any noise that may be introduced into the circuit by toggling T1 while it is operating in a sub-threshold regime.

In some embodiments, establishing an electrical connection between a voltage supply (e.g., associated with voltage $V_{HSA}$) and DL 405 may cause the voltage supply to raise the voltage of DL 405 to an initial sensing voltage (e.g., $V_{IS}$) before memory cell 410 is coupled to DL 405, as described earlier with respect to FIG. 4. In some embodiments, establishing an electrical connection between AMPCAP 425 and DL 405 after memory cell 410 is coupled to DL 405 may cause charge to be transferred between AMPCAP 425 and memory cell 410, which may be used to detect a value of memory cell 410.

Detailed operations of the circuit 600 are further illustrated and described with reference to FIG. 7.

Figure 7:
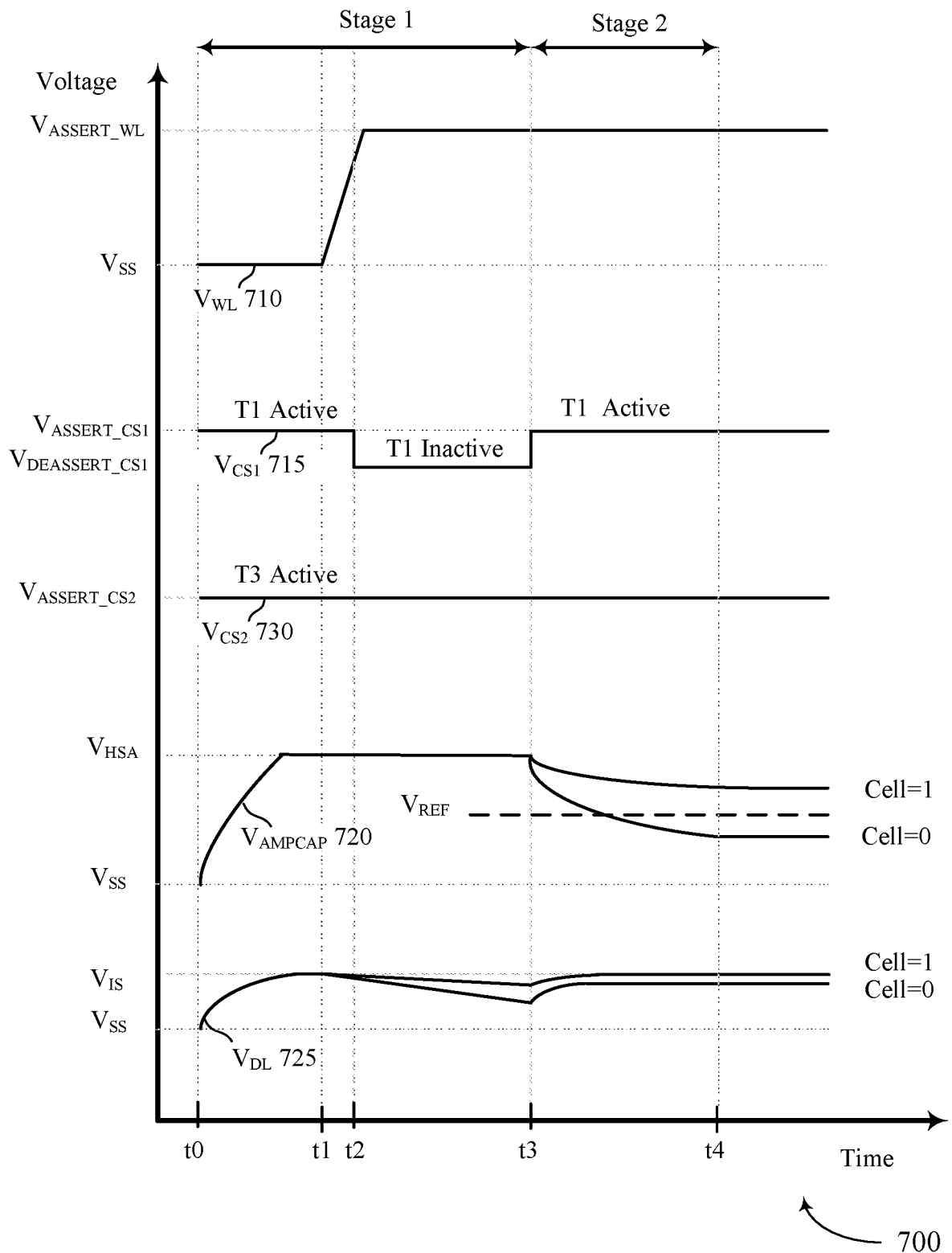
FIG. 7 illustrates an example of a timing diagram that supports techniques for reading a memory cell using multi-stage memory sensing in accordance with embodiments of the present disclosure.

FIG. 7 illustrates an example of a timing diagram 700 that supports reading a memory cell using multi-stage memory sensing in accordance with embodiments of the present disclosure. The timing diagram 700 illustrates various signals during a read operation using multi-phase memory sensing. The timing diagram 700 shows various voltage levels associated with the components of the circuit 600 described with reference to FIG. 6 to illustrate how the techniques for reading a memory cell using multi-stage memory sensing provide a fast and reliable read operation.

Timing diagram 700 is similar to timing diagram 500, but includes an additional control signal $V_{CS2}$ associated with additional transistor T3. In this example, the control signal $V_{CS2}$ for transistor T3 remains asserted for the duration of the read operation, while the control signal $V_{CS1}$ for transistor T1 is toggled in the same manner as previously described with respect to FIG. 5. The operation of the circuit is therefore conceptually similar to that described with respect to FIGS. 4-5, with additional transistor T3 acting as a source-follower device between T1 and DL 405 to reduce any noise associated with toggling transistor T1 while it is operating in a sub-threshold regime.

In this example, $V_{CS2}$ 730 may be asserted to activate transistor T3 and couple digit line 405 with a node (e.g., a drain or source node) of transistor T1. In some examples, $V_{CS2}$ 730 is asserted whenever circuit 600 is active; e.g., $V_{CS2}$ may be set to a fixed voltage that causes transistor T3 to remain always activated.

$V_{CS1}$ 715 may be asserted to activate transistor T1 to couple a node (e.g., a source or drain node) of T3 with AMPCAP 425. Thus, during the portions of the read operation shown between t0-t1 and t3-t4 when $V_{CS1}$ and $V_{CS2}$ are both asserted and T1 and T3 are both activated, AMPCAP 425 is coupled with DL 405 (by way of T1 and T3). During the portion of the read operation shown between t2-t3, when $V_{CS2}$ is asserted and $V_{CS1}$ is deasserted, AMPCAP 425 is uncoupled (isolated) from DL 405. The periods of coupling and uncoupling of AMPCAP 425 with DL 405 are essentially the same as previously described with respect to FIG. 5, and therefore the circuit behavior, timing, and voltages for $V_{WL}$, $V_{AMPCAP}$, and $V_{DL}$ are essentially the same as depicted in FIG. 5 (neglecting any potential noise reduction of $V_{AMPCAP}$ due to the introduction of source-follower transistor T3). The advantages of the multi-stage memory sensing approach described with respect to FIGS. 6-7 are also similar to those described with respect to FIGS. 4-5.

Figure 8:
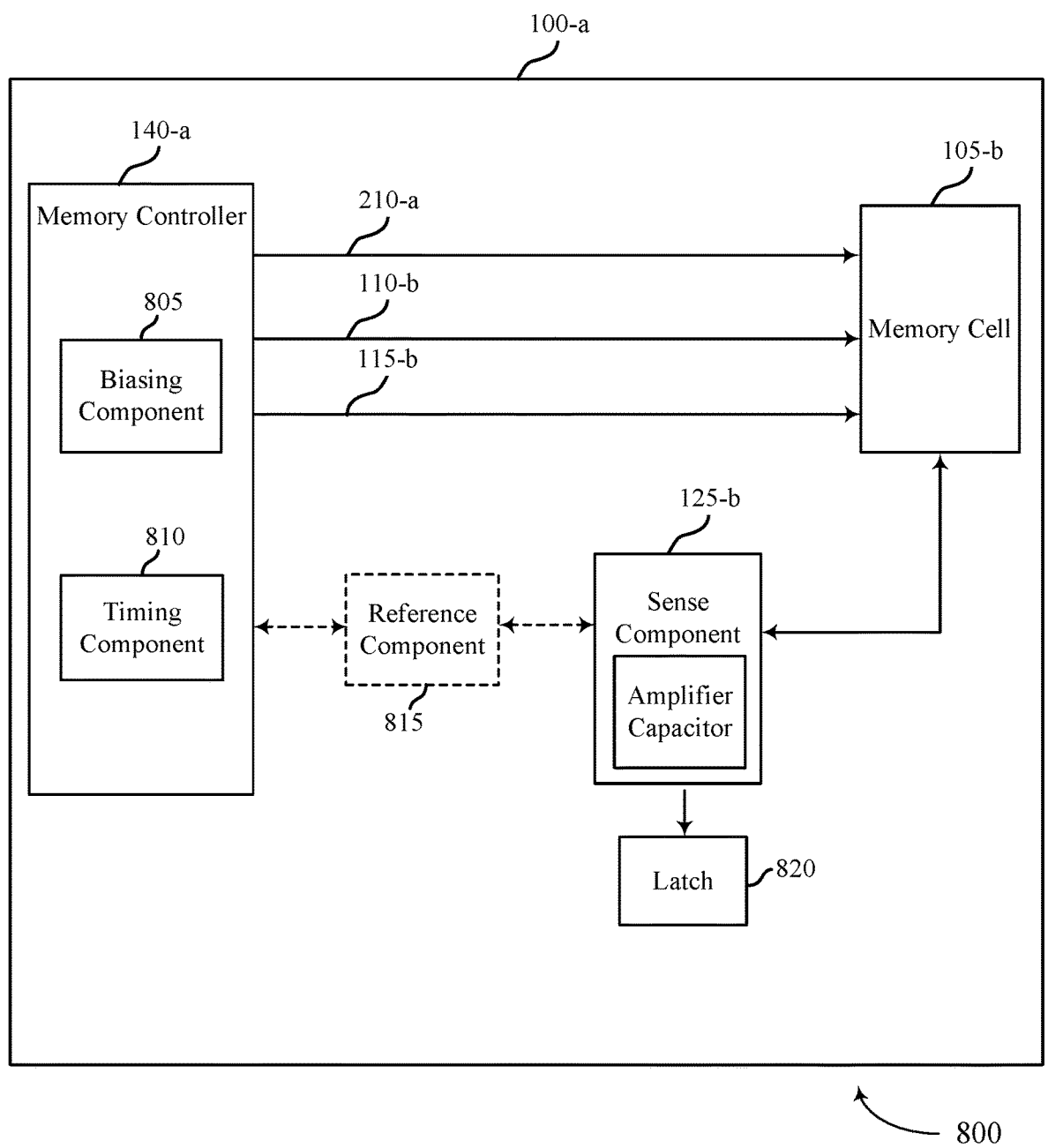
FIG. 8 illustrates a block diagram of a device that supports techniques for reading a memory cell using multi-stage memory sensing in accordance with embodiments of the present disclosure.

FIG. 8 shows a block diagram 800 of a memory device that supports techniques for reading a memory cell using multi-stage memory sensing in accordance with embodiments of the present disclosure. Memory array 100-*a* may be referred to as an electronic memory apparatus and includes memory controller 140-*a* and memory cell 105-*b*, which may be examples of memory controller 140 and memory cell 105 described with reference to FIG. 1. Memory controller 140-*a* may include a biasing component 805 and a timing component 810, and may operate memory array 100-*a* as described with reference to FIG. 1. Memory controller 140-*a* may be in electronic communication with word line 110-*b*, digit line 115-*b*, plate line 210-*a*, and sense component 125-*b*, which may be examples of word line 110, digit line 115, plate line 210, and sense component 125 described with reference to FIGS. 1 and 2. Memory array 100-*a* may also include a reference component 815 and a latch 820. The components of memory array 100-*a* may be in electronic communication with each other and may perform the functions described with reference to FIGS. 1 through 3. In some cases, the reference component 815, the sense component 125-*b*, and the latch 820 may be components of memory controller 140-*a*.

Memory controller 140-*a* may be configured to assert a signal(s) on one or more of word line 110-*b*, plate line 210-*a*, or digit line 115-*b* by applying voltages to those various nodes. For example, the biasing component 805 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105. The biasing component 805 may also provide voltage potentials to the reference component 815 in order to generate a reference signal for sense component 125-*b*. Additionally, the biasing component 805 may provide voltage potentials for the operation of the sense component 125-*b*. In some embodiments, the memory controller 140-*a* may control various phases of a read operation. In some cases, the memory controller 140-*a* may assert a control signal(s) to activate a transistor(s) to couple an amplifier capacitor with a digit line 115-*b*. Memory controller 140-*a* may also assert a signal on word line 110-*b* for a period of time to couple a memory cell 105-*b* to a digit line 115-*b*.

In some cases, the memory controller 140-*a* may perform its operations using the timing component 810. For example, the timing component 810 may control the timing of the various word line selections, digit line selections, or plate line biasing, including timing for switching and voltage application to perform the memory functions, such as reading and writing, discussed herein. In some cases, the timing component 810 may control the operations of the biasing component 805. In some cases, the timing component 810 may control the timing of asserting or deasserting control signals to activate or deactivate one or more transistors (e.g., transistor T1 and/or transistor T3).

In some cases, the memory array 100-*a* may include the reference component 815. The reference component 815 may include various components to generate a reference signal for the sense component 125-*b*. The reference component 815 may include circuitry configured to produce reference signals. In some cases, the reference component 815 may include other ferroelectric memory cells 105. In some examples, the reference component 860 may be configured to output a voltage with a value between the two sense voltages, as described with reference to FIG. 3. Or the reference component 815 may be designed to output a virtual ground voltage (e.g., approximately 0V).

The sense component 125-*b* may compare a signal from memory cell 105-*b* (through digit line 115-*b*) with a reference signal (e.g., a reference signal from the reference component 815). Upon determining the logic state, the sense component may then store the output in the latch 820, where it may be used in accordance with the operations of an electronic device of which memory array 100-*a* is a part.

In some embodiments, the memory device described above may include an amplifier capacitor configured to raise a voltage of a digit line and amplify a signal from the ferroelectric memory cell during a read operation. In some embodiments, the sense component may be configured to use a reference voltage to distinguish whether a charge stored on the ferroelectric memory cell corresponds to a first logic state or a second logic state, by comparing the voltage at a node of the amplifier capacitor with the reference voltage. In some embodiments, the memory device described above may include a transistor that is configured to couple, uncouple, and recouple the amplifier capacitor with the digit line when the transistor is activated, deactivated, and reactivated, respectively. In some embodiments, the memory device described above is configured to identify that a trigger condition has been satisfied after reactivating the transistor, and activate a latch coupled with the amplifier capacitor based on identifying that the trigger has been satisfied.

Figure 9:
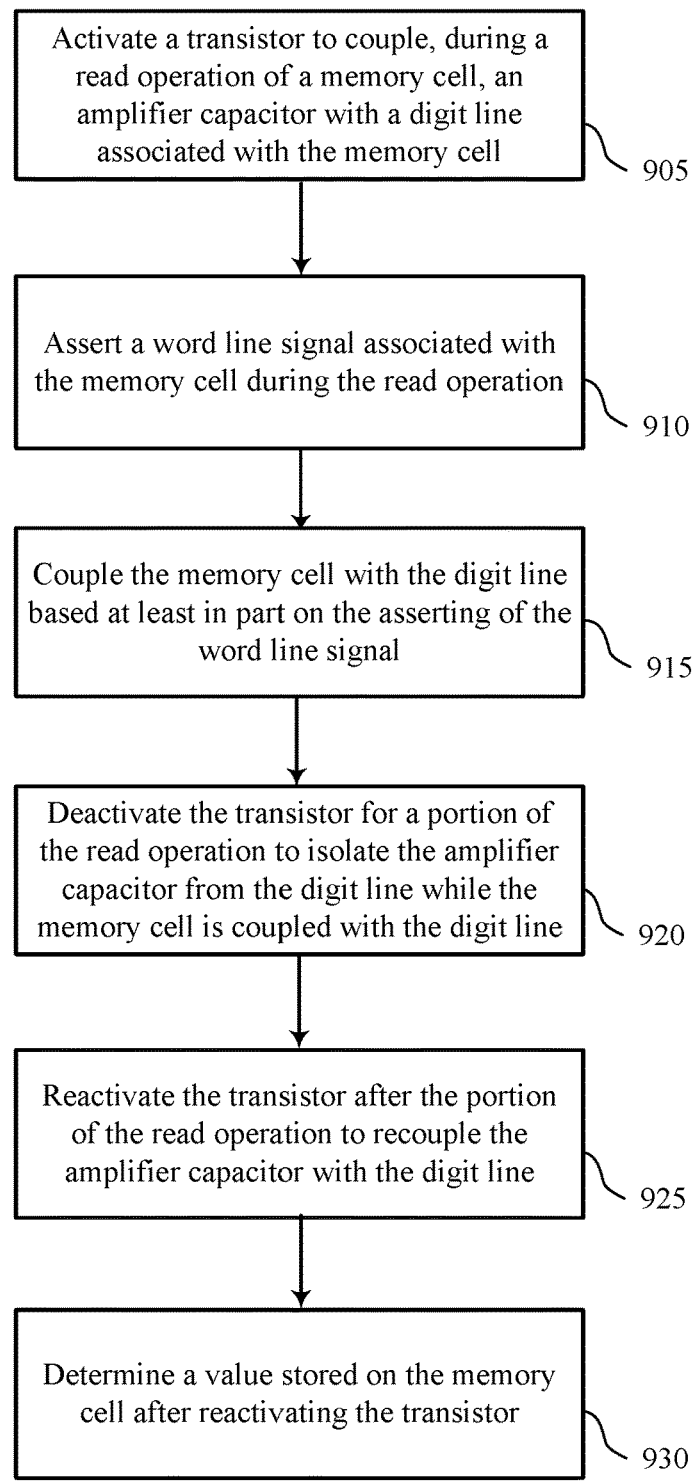
FIGS. 9 and 10 illustrate methods for reading a memory cell using multi-stage memory sensing in accordance with embodiments of the present disclosure.

FIG. 9 shows a flowchart illustrating a method 900 for techniques for reading a memory cell using multi-stage memory sensing in accordance with embodiments of the present disclosure. The operations of method 900 may be implemented by a memory array 100 or its components as described herein. For example, the operations of method 900 may be performed by a memory controller as described with reference to FIGS. 1 and 8. In some examples, a memory array 100 may execute a set of codes to control the functional elements of the device to perform the functions described below. Additionally or alternatively, the memory array 100 may perform aspects of the functions described below using special-purpose hardware.

At 905, the memory array 100 may activate a transistor (e.g., T1 430) to couple, during a read operation of a memory cell (e.g., memory cell 410), an amplifier capacitor (e.g., AMPCAP 425) with a digit line (e.g., DL 405) associated with the memory cell. In some examples, the transistor is activated by asserting a control signal (e.g., $V_{CS1}$) coupled to a gate (e.g., at node 450) of the transistor. In some examples, the amplifier capacitor is coupled to a source of the transistor and the digit line is coupled to a drain of the transistor. In some examples, the amplifier capacitor is precharged to a predetermined voltage (e.g., $V_{HSA}$) before activating the transistor. In some examples, activating the transistor causes an electric charge to be transferred between the amplifier capacitor and the memory cell. In some examples, the transistor is part of a cascode.

At 910, the memory array 100 may assert a word line signal (e.g., $V_{WL}$) associated with the memory cell during the read operation.

At 915, the memory array 100 may couple the memory cell with the digit line based at least in part on the asserting of the word line signal.

At 920, the memory array 100 may deactivate the transistor for a portion of the read operation to isolate the amplifier capacitor from the digit line while the memory cell is coupled with the digit line. In some examples, the transistor is deactivated by deasserting the control signal. In some examples, the memory array 100 may assert the word line signal at 905 at the same time as or before deactivating the transistor for the portion of the read operation.

At 925, the memory array 100 may reactivate the transistor after the portion of the read operation to recouple the amplifier capacitor with the digit line.

At 930, the memory array 100 may determine a value stored on the memory cell after reactivating the transistor. In some examples, determining the value is based at least in part on the charge transferred between the amplifier capacitor and the memory cell. In some examples, the memory array 100 may determine the value by comparing a voltage at a node (e.g., node 455) of the amplifier capacitor to a reference voltage (e.g., reference 225). In some examples, the memory array may identify that a trigger condition is satisfied after reactivating the transistor and activate a latch (e.g., latch 820) coupled with the amplifier capacitor based at least in part on identifying that the trigger condition is satisfied. In some examples, the trigger condition is satisfied when a timer having a predetermined duration has expired after reactivating the transistor. In some examples, the trigger condition is satisfied when a voltage level at a node of the amplifier capacitor has settled to a substantially steady-state value. In some examples, activating the latch may include saving the previously determined value.

In some examples, the operations of method 900 may be performed in a different order than described with respect to FIG. 9. In some examples, some operations of method 900 may be performed simultaneously or nearly simultaneously.

An apparatus for performing the method 900 is described. The apparatus may include means for activating a transistor to couple, during a read operation of a memory cell, an amplifier capacitor with a digit line associated with the memory cell; means for asserting a word line signal associated with the memory cell during the read operation; means for coupling the memory cell with the digit line based at least in part on the asserting of the word line signal; means for deactivating the transistor for a portion of the read operation to isolate the amplifier capacitor from the digit line while the memory cell is coupled with the digit line; means for reactivating the transistor after the portion of the read operation to recouple the amplifier capacitor with the digit line; and means for determining a value stored on the memory cell after reactivating the transistor.

Figure 10:
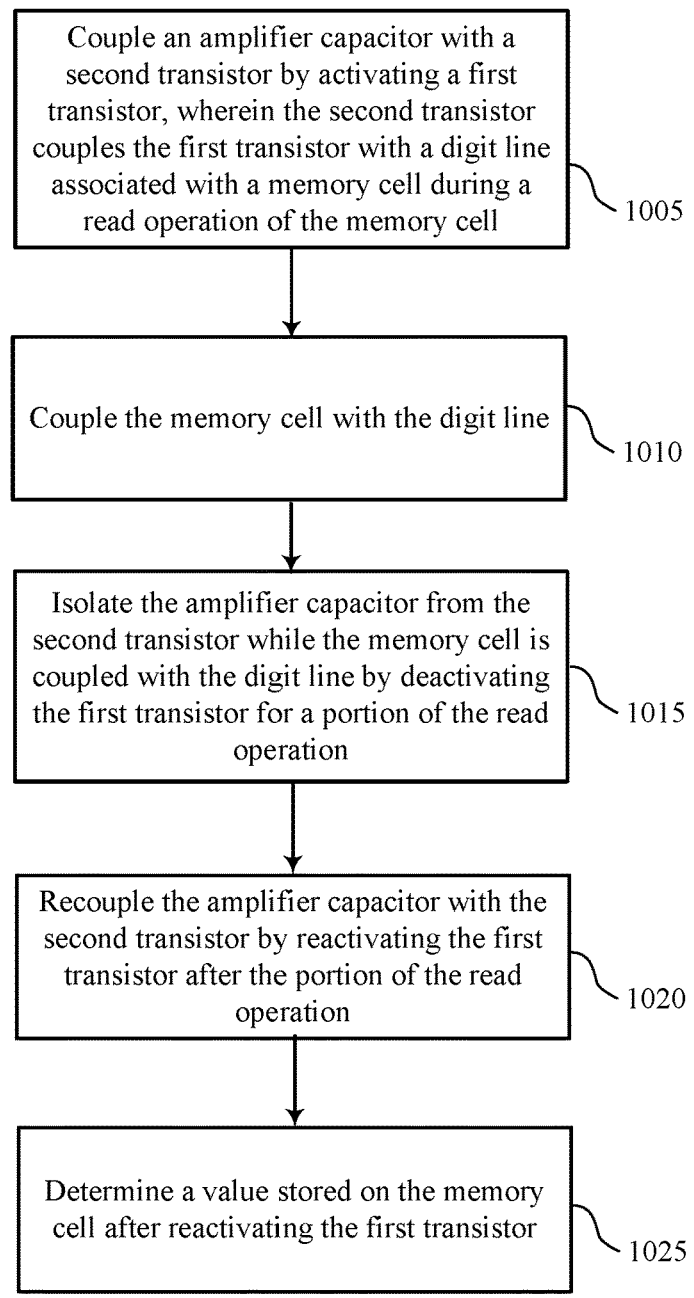

FIG. 10 shows a flowchart illustrating a method 1000 for techniques for reading a memory cell using multi-stage memory sensing in accordance with embodiments of the present disclosure. The operations of method 1000 may be implemented by a memory array 100 or its components as described herein. For example, the operations of method 1000 may be performed by a memory controller as described with reference to FIGS. 1 and 8. In some examples, a memory array 100 may execute a set of codes to control the functional elements of the device to perform the functions described below. Additionally or alternatively, the memory array 100 may perform aspects of the functions described below using special-purpose hardware.

At 1005, the memory array 100 may couple, during a read operation of a memory cell (e.g., memory cell 410), an amplifier capacitor (e.g., AMPCAP 425) with a second transistor (e.g., T3) by activating a first transistor (e.g., T1). In some examples, the first transistor is activated by asserting a first control signal (e.g., $V_{CS1}$) coupled to a gate of the first transistor. In some examples, activating the first transistor causes an electric charge to be transferred to the amplifier capacitor from the memory cell. In some examples, the first transistor is part of a cascode. In some examples, a first node (e.g., 455) of the amplifier capacitor is coupled to the drain of the first transistor, and the source of the first transistor is coupled to the drain of the second transistor. In some examples, the second transistor couples the first transistor with a digit line associated with a memory cell during a read operation of the memory cell.

At 1010, the memory array 100 may couple the memory cell with the digit line. In some examples, the memory array 100 may couple the memory cell with the digit line based at least in part on a word line signal associated with the memory cell being asserted.

At 1015, the memory array 100 may isolate the amplifier capacitor from the second transistor while the memory cell is coupled with the digit line by deactivating the first transistor for a portion of the read operation.

At 1020, the memory array 100 may recouple the amplifier capacitor with the second transistor by reactivating the first transistor after the portion of the read operation.

At 1025, the memory array 100 may determine a value stored on the memory cell after reactivating the first transistor. In some examples, determining the value is based at least in part on the charge transferred to the amplifier capacitor from the memory cell. In some examples, the memory array 100 may determine the value by comparing a voltage at a node of the amplifier capacitor to a reference voltage (e.g., reference 225). In some examples, the memory array may identify that a trigger condition is satisfied after reactivating the first transistor and activate a latch coupled with the amplifier capacitor based at least in part on identifying that the trigger condition is satisfied. In some examples, the trigger condition is satisfied when a timer having a predetermined duration has expired after reactivating the transistor. In some examples, the trigger condition is satisfied when a voltage level at a node of the amplifier capacitor has settled to a substantially steady-state value. In some examples, activating the latch may include saving the previously determined value.

In some examples, the operations of method 1000 may be performed in a different order than described with respect to FIG. 10. In some examples, some operations of method 1000 may be performed simultaneously or nearly simultaneously.

An apparatus for performing the method 1000 is described. The apparatus may include means for coupling an amplifier capacitor with a second transistor by activating a first transistor, wherein the second transistor couples the first transistor with a digit line associated with a memory cell during a read operation of the memory cell; means for coupling the memory cell with the digit line; means for isolating the amplifier capacitor from the second transistor while the memory cell is coupled with the digit line by deactivating the first transistor for a portion of the read operation; means for recoupling the amplifier capacitor with the second transistor by reactivating the first transistor after the portion of the read operation; and means for determining a value stored on the memory cell after reactivating the first transistor.

It should be noted that the methods described above describe possible implementations, and that the operations and the steps may be rearranged or otherwise modified and that other implementations are possible. Further, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized.

As used herein, the term "substantially" means that the modified characteristic (e.g., a verb or adjective modified by the term substantially) need not be absolute but is close enough so as to achieve the advantages of the characteristic.

As used herein, the term "asserting" a signal may refer to setting a voltage of a signal to a level that causes activation or selection of an associated component. For example, asserting a word line may cause selection of a memory cell. Asserting a control signal may cause activation of a transistor. In some cases, a signal is asserted by raising the voltage from a lower value to a higher value. In other cases, a signal is asserted by lowering the voltage from a higher value to a lower value. That is, asserting a signal does not imply a particular polarity of the signal.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate. In some cases, a transistor may operate in a sub-threshold regime when a voltage applied at the transistor gate is below the threshold voltage. A transistor operating in the sub-threshold regime may experience sub-threshold conduction. In some cases, circuitry may be designed to use transistors in the sub-threshold regime; e.g., the circuitry may be designed such that a transistor is considered to be "activated" when operating in a sub-threshold regime.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    asserting a word line signal associated with a memory cell during a read operation of the memory cell;
    coupling the memory cell with a digit line associated with the memory cell based at least in part on the asserting of the word line signal;
    activating a transistor to couple, during the read operation, an amplifier capacitor with the digit line;
    deactivating the transistor for a portion of the read operation to isolate the amplifier capacitor from the digit line while the memory cell is coupled with the digit line;

reactivating the transistor after the portion of the read operation to recouple the amplifier capacitor with the digit line; and determining a value stored on the memory cell after reactivating the transistor.

2. The method of claim 1, further comprising:
asserting the word line signal at the same time as or before deactivating the transistor for the portion of the read operation.

3. The method of claim 1, further comprising:
comparing a voltage at a first node of the amplifier capacitor to a reference voltage, wherein determining the value is based at least in part on the comparison.

4. The method of claim 1, further comprising:
identifying that a trigger condition is satisfied after reactivating the transistor; and
activating a latch coupled with the amplifier capacitor based at least in part on identifying that the trigger condition is satisfied.

5. The method of claim 4, further comprising:
determining that a timer having a predetermined duration has expired after reactivating the transistor, wherein identifying that the trigger condition is satisfied is based at least in part on determining that the timer has expired.

6. The method of claim 1, further comprising:
asserting a control signal coupled to a gate of the transistor, wherein activating the transistor is based at least in part on the asserting of the control signal; and
deasserting the control signal, wherein deactivating the transistor is based in part on the deasserting of the control signal.

7. The method of claim 1, wherein the amplifier capacitor is coupled to a drain of the transistor and the digit line is coupled to a source of the transistor.

8. The method of claim 1, wherein activating the transistor causes an electric charge to be transferred to the amplifier capacitor from the memory cell, and wherein determining the value is based at least in part on the transferred charge.

9. The method of claim 1, further comprising:
pre-charging the amplifier capacitor to a predetermined charge before activating the transistor.

10. The method of claim 1, wherein the transistor is part of a cascode.

11. A method, comprising:
coupling an amplifier capacitor with a second transistor by activating a first transistor, wherein the second transistor couples the first transistor with a digit line associated with a memory cell during a read operation of the memory cell;
coupling the memory cell with the digit line;
isolating the amplifier capacitor from the second transistor while the memory cell is coupled with the digit line by deactivating the first transistor for a portion of the read operation;
recoupling the amplifier capacitor with the second transistor by reactivating the first transistor after the portion of the read operation; and
determining a value stored on the memory cell after reactivating the first transistor.

12. The method of claim 11, wherein the second transistor is activated for an entire duration of the read operation.

13. The method of claim 11, wherein activating the first transistor causes electric charge to be transferred from the memory cell, and wherein determining the value is based at least in part on the transferred charge.

14. The method of claim 11, further comprising:
comparing a voltage at a first node of the amplifier capacitor to a reference voltage, wherein determining the value is based at least in part on the comparison.

15. The method of claim 11, further comprising:
identifying that a trigger condition is satisfied after reactivating the first transistor; and
activating a latch coupled with the amplifier capacitor based at least in part on identifying that the trigger condition is satisfied.

16. The method of claim 15, further comprising:
determining that a timer having a predetermined duration has expired after reactivating the first transistor, wherein identifying that the trigger condition is satisfied is based at least in part on determining that the timer has expired.

17. The method of claim 11, wherein:
a first node of the amplifier capacitor is coupled to a drain of the first transistor, and
a source of the first transistor is coupled to a drain of the second transistor.

18. An apparatus, comprising:
a ferroelectric memory cell coupled with a digit line;
an amplifier capacitor;
a first transistor coupled with the digit line and configured to be activated for a duration of a read operation on the ferroelectric memory cell; and
a second transistor coupled with the first transistor and the amplifier capacitor, the second transistor configured to:
activate for the read operation;
deactivate for a portion of the read operation; and
reactivate after the portion of the read operation, wherein the first transistor and the second transistor are configured to establish an electrical connection between the amplifier capacitor and the digit line when the second transistor is activated and reactivated during the read operation.

19. The apparatus of claim 18, wherein:
a source of the first transistor is coupled with the digit line and a drain of the first transistor is coupled with a source of the second transistor, and
a drain of the second transistor is coupled with the amplifier capacitor.

20. The apparatus of claim 18, further comprising:
a sense amplifier coupled with the amplifier capacitor and the second transistor, wherein the sense amplifier is configured to determine a value stored on the ferroelectric memory cell.

21. A memory device, comprising:
a memory cell;
a digit line coupled with the memory cell;
an amplifier capacitor coupled with the digit line;
a controller configured to:
assert, during a read operation of the memory cell, a word line signal associated with the memory cell;
couple the memory cell with the digit line based at least in part on the asserting of the word line signal;
activate a transistor to couple, during the read operation, the amplifier capacitor with the digit line;
deactivate the transistor for a portion of the read operation to isolate the amplifier capacitor from the digit line while the memory cell is coupled with the digit line;
reactivate the transistor after the portion of the read operation to recouple the amplifier capacitor with the digit line; and determine a value stored on the memory cell after reactivating the transistor.

22. The memory device of claim 21, wherein the controller is further configured to:
assert the word line signal associated with the memory cell at the same time as or before the controller deactivates the transistor for the portion of the read operation.

23. The memory device of claim 22, wherein the controller is further configured to:
compare a voltage at a first node of the amplifier capacitor to a reference voltage, wherein determining the value is based at least in part on the comparison.

24. The memory device of claim 22, wherein the controller is further configured to:
identify that a trigger condition is satisfied after reactivating the transistor; and
activate a latch coupled with the amplifier capacitor based at least in part on identifying that the trigger condition is satisfied.

25. The memory device of claim 24, wherein the controller is further configured to:
determine that a timer having a predetermined duration has expired after reactivating the transistor, wherein identifying that the trigger condition is satisfied is based at least in part on determining that the timer has expired.

* * * * *